United States Patent
Telser et al.

(10) Patent No.: US 10,824,072 B2
(45) Date of Patent: Nov. 3, 2020

(54) METHOD FOR GENERATIVE PRODUCTION OF RELIEF PRINTING PLATES BY MONOMER DIFFUSION THROUGH AN INTEGRAL MASK LAYER

(71) Applicant: Flint Group Germany GmbH, Stuttgart (DE)

(72) Inventors: Thomas Telser, Heidelberg-Wieblingen (DE); Matthias Beyer, Pfinztal-Berghausen (DE); Daniel Fleischer, Rheinau (DE)

(73) Assignee: Flint Group Germany GmbH (DE)

( * ) Notice: Subject to any disclaimer, the term of this patent is extended or adjusted under 35 U.S.C. 154(b) by 314 days.

(21) Appl. No.: 16/064,092

(22) PCT Filed: Dec. 19, 2016

(86) PCT No.: PCT/EP2016/081647
§ 371 (c)(1),
(2) Date: Jun. 20, 2018

(87) PCT Pub. No.: WO2017/108649
PCT Pub. Date: Jun. 29, 2017

(65) Prior Publication Data
US 2018/0373142 A1 Dec. 27, 2018

(30) Foreign Application Priority Data
Dec. 21, 2015 (EP) .................................... 15201476

(51) Int. Cl.
*G03F 7/12* (2006.01)
*G03F 7/32* (2006.01)
(Continued)

(52) U.S. Cl.
CPC ............ *G03F 7/0037* (2013.01); *G03F 7/032* (2013.01); *G03F 7/033* (2013.01); *G03F 7/12* (2013.01); *B29C 2035/0838* (2013.01)

(58) Field of Classification Search
CPC ..... G03F 7/12; G03F 7/30; G03F 7/32; B41C 1/00
See application file for complete search history.

(56) References Cited

U.S. PATENT DOCUMENTS 4,323,636 A  4/1982 Chen
5,061,606 A * 10/1991 Telser .................... G03F 7/325
430/306

(Continued)

FOREIGN PATENT DOCUMENTS

DE  102012013532 A1  1/2014
EP  332070 A2  9/1989
(Continued)

OTHER PUBLICATIONS

International Search Report for PCT/EP2016/081647 dated Apr. 10, 2017.
(Continued)

*Primary Examiner* — Cachet I Proctor
(74) *Attorney, Agent, or Firm* — Faegre Drinker Biddle & Reath LLP

(57) ABSTRACT

The invention relates to a method for generative production of relief printing plates, wherein a support with a polymeric substrate layer and a laser-ablatable mask layer is provided, the polymeric substrate layer containing a first binder. A mask with openings corresponding to pixels is produced by imagewise laser ablation of the mask layer. A liquid containing a reactive monomer is then applied over the surface of the mask-covered polymeric substrate layer, and the liquid or the reactive monomer diffuses through the openings of the mask into the polymeric substrate layer for a (Continued)

defined exposure time so as to form a relief. The excess liquid or the excess monomer and optionally the mask are removed from the surface, and the resulting relief is fixed by crosslinking.

18 Claims, 2 Drawing Sheets

(51) Int. Cl.
*G03F 7/00* (2006.01)
*G03F 7/033* (2006.01)
*G03F 7/032* (2006.01)
*B29C 35/08* (2006.01)

(56) References Cited

U.S. PATENT DOCUMENTS

| | | | |
|---|---|---|---|
| 5,262,275 A | 11/1993 | Fan | |
| 6,641,772 B2 | 11/2003 | Gelbart | |
| 7,226,709 B1 * | 6/2007 | Kidnie | B41C 1/05 430/200 |
| 2003/0138733 A1 | 7/2003 | Sachdev et al. | |
| 2004/0131778 A1 | 7/2004 | Verhoest et al. | |
| 2008/0053326 A1 * | 3/2008 | Murphy | G03F 7/0037 101/395 |
| 2011/0219973 A1 * | 9/2011 | Gullentops | B41N 1/12 101/401.1 |

FOREIGN PATENT DOCUMENTS

| | | | | |
|---|---|---|---|---|
| EP | 0641648 A1 | 3/1995 | | |
| EP | 1170121 A1 | 1/2002 | | |
| EP | 1239329 A2 | 9/2002 | | |
| EP | 1428666 A1 | 6/2004 | | |
| EP | 1552922 A1 | 7/2005 | | |
| EP | 1594005 A2 * | 11/2005 | | G03F 7/203 |
| EP | 2033778 A1 | 3/2009 | | |
| EP | 2199082 A1 | 6/2010 | | |
| WO | WO-2009099417 A1 * | 8/2009 | | B41C 1/14 |
| WO | WO-2012074994 A1 | 6/2012 | | |
| WO | WO-2012175525 A1 | 12/2012 | | |
| WO | WO-2014095361 A1 | 6/2014 | | |
| WO | WO-2014209428 A1 | 12/2014 | | |

OTHER PUBLICATIONS

Written Opinion of the International Searching Authority for PCT/EP2016/081647 dated Apr. 10, 2017.

* cited by examiner

METHOD FOR GENERATIVE PRODUCTION OF RELIEF PRINTING PLATES BY MONOMER DIFFUSION THROUGH AN INTEGRAL MASK LAYER

CROSS-REFERENCE TO RELATED APPLICATIONS

This application is a national stage application (under 35 U.S.C. § 371) of PCT/EP2016/081647, filed Dec. 19, 2016, which claims benefit of European Application No. 15201476.7, filed Dec. 21, 2015, both of which are incorporated herein by reference in their entirety.

The invention relates to a method for producing relief printing plates, for example flexographic printing plates, wherein a support with a polymeric substrate layer is provided, a liquid containing a reactive monomer is applied imagewise to the polymeric substrate layer, and the excess liquid is then removed from the surface and the resulting relief is fixed by crosslinking.

Relief printing plates such as flexographic printing plates are used for example in the printing of a wide variety of packages with low-viscosity printing inks. Polar printing inks based on water or alcohol are usually used as printing inks. Because of the printing method, flexographic printing plates are required that are soft, elastic, and resistant to polar flexographic printing inks.

Conventional flexographic printing plates therefore contain a flexible non-polar binder, usually block copolymers based on styrene-isoprene or styrene-butadiene, in combination with monomers, plasticizers and one or a plurality of photoinitiators (cf. for example U.S. Pat. No. 4,323,636). This photopolymerizable layer is generally a few millimeters thick and is positioned on a dimensionally stable support, generally a PET film. The relief is produced by exposure to UV light through a film negative. On exposure, the exposed areas are crosslinked, while the unexposed areas of the flexographic printing plate remain soluble and are removed by washing with a suitable organic solvent.

As an alternative to film exposure, flexographic printing plates can also be exposed using a laser-produced mask. The thin ablatable mask layer is located on the photopolymerizable layer (cf. for example U.S. Pat. No. 5,262,275). A mask is produced by imagewise ablation though which UV light exposure is subsequently carried out.

Regardless of whether UV exposure of the photopolymerizable layer is carried out by means of a film or a laser-produced integral mask, the relief must then be produced by washing out with suitable organic solvents (cf. for example EP 332 070).

When the relief is washed out, the crosslinked areas of the flexographic printing plate are also caused by the solvent to swell up. After this, the solvent must again be removed in a drying step. Because of the temperature sensitivity of the PET support film, drying of the flexographic printing plates cannot be carried out above a maximum temperature of 60° C. The drying times required are long. Depending on the layer thickness of the flexographic printing plate, drying times of 30 minutes to several hours are required.

For this reason, there has been no shortage of attempts to produce flexographic printing plates that can be more rapidly developed. For example, flexographic printing plates can also be thermally developed (cf. for example EP 1239329 or EP 1170121). In this case, the flexographic printing plates are heated to the melting temperature after imagewise exposure. This causes the unexposed areas of the flexographic printing plate to become sticky, and they are then peeled off by applying a web or fabric. However, the equipment required for this method is complex, as multiple layers must be successively peeled off in order to produce a sufficient relief. Moreover, the resolution of the flexographic printing plates produced in this manner is lower than that of flexographic printing plates washed out in solvents.

In principle, therefore, a method would be desirable in which the relief is produced not by means of a development step, but generatively (i.e. by building up the relief).

This would allow the production time of a relief printing plate to be significantly shortened and simplified. Moreover, significantly less material would be required, and the environmental performance of a printing plate manufactured by this method would be substantially improved.

For high-quality printing of flexible packages, flexographic printing plates are currently used in a thickness of 1.14 mm (including the 0.175-mm-thick support film). The printing plates have a relief depth of 0.4 to 0.7 mm. If the flexographic printing plates are washed out with solvent, free-standing elements can be imaged on a flexographic printing plate up to a fineness of 200 µm (free-standing relief point) or 100 µm (free-standing line).

Finer elements can be imaged on a flexographic printing plate only if a lower relief depth is selected. DE 102012013532 describes a flexographic printing method in which relief depths of less than 250 µm are used. The advantages of this method are that the path to be printed can be guided in a more favorable manner and there are no pattern-related mechanical fluctuations in the printing machine. It is important in this method that the relief base cannot be colored with printing ink, or it will also be printed. It is still difficult to achieve this today under production conditions. Another difficulty of the method is the precise setting of a lower relief depth.

Ordinarily, the relief depth is adjusted by exposing the flexographic printing plate to light from the rear side of the plate. This allows the relief depth to be controlled within a range of ±50 µm. If an absolute relief depth of 100 µm is to be set, this precision is no longer sufficient. In this case as well, a generative method in which the relief is produced by building up rather than washing away would provide system-inherent advantages.

Even finer printing elements in the size range of only a few µm are required for special applications such as the printing of conductive paths for touch screen displays. It would be advantageous to be able to produce these fine structures by means of flexographic printing as well. For this purpose, flexographic printing plates are required that have lower relief depth (<100 µm) but can image fine details in a size range of 5 to 50 µm in a reliable and reproducible manner (cf. for example WO 2014/209428).

There is therefore a demand for flexographic printing plates with a low relief and high resolution, wherein the relief is preferably produced by a generative method.

Various methods are known for producing a printing relief by means of an ink jet in layers, i.e. generatively (cf. for example EP 0641648, US 2004/0131778, EP 2033778, WO 2012/175525, WO 2014/095361, US 2008/0053326).

The general principle of these patent applications is imagewise application of a reactive monomer mixture, for example a monomer/photoinitiator mixture, by means of an inkjet printing process to a suitable substrate and then immobilizing or curing it by means of UV light as quickly as possible, so that the applied droplets cannot spread or merge. The relief is built up in this manner by applying multiple layers in succession.

However, there are decisive drawbacks in the generation of a flexographic printing plate by means of an inkjet printing process. Only low-viscosity liquids can be applied using an inkjet printing head. The limit viscosity in this case is usually <15 mPa. For this reason, only relatively small molecules can be used to form the reactive monomer mixture. These monomers are not capable of forming a flexible, resistant material such as that required for flexographic printing plates. As the reactive monomers are usually selected from the class of the acrylic acid or methacrylic acid esters, the generation materials are either too hard, or they are sufficiently soft but then not resistant to the polar flexographic printing inks.

US 2008/0053326 describes a method in which elastic prepolymers or polymers are applied via an inkjet printing process and crosslinked in order to build up a flexographic relief material in layers. The materials must be heated so that low-viscosity melts are produced that can be applied by means of the inkjet process.

EP 1552922 avoids the viscosity problem by dispersing solid particles in a support liquid and then applying this dispersion in layers in an inkjet printing process. In this method, however, the support liquid must again be removed, which makes the process complex.

U.S. Pat. No. 6,641,772 describes a stereolithography method by means of which flexographic materials can be built up. In this case, a temperature-sensitive resin solution or melt is heated with an IR laser at certain dots and thermally cured to form three-dimensional structures. The equipment used in this method is complex.

DESCRIPTION OF THE INVENTION

Surprisingly, it was found that flexographic printing plates can be produced by a generative method, wherein
a) a support with a polymeric substrate layer and a laser-ablatable mask layer is provided, with the polymeric substrate layer containing a first binder,
b) a mask with openings corresponding to pixels is produced by imagewise laser ablation of the mask layer,
c) a liquid containing a reactive monomer is applied over the surface of the mask-covered polymeric substrate layer,
d) the liquid or the reactive monomer diffuses through the openings of the mask into the polymeric substrate layer for a defined exposure time so as to form a relief,
e) the excess liquid or the excess monomer and optionally the mask are then removed from the surface, and
f) the resulting relief is fixed by crosslinking.

The core concept of the invention is that the reactive liquid is given sufficient time to diffuse through the openings of the ablated mask in the polymeric substrate layer and form the relief, with the relief then being fixed by crosslinking. Here, the resolution of the flexographic printing plate formed essentially depends on the dimensions of the mask openings, the diffusion time selected, the diffusion rate of the reactive liquid into the polymeric substrate layer, and the barrier behavior of the mask with respect to the reactive liquid.

The liquid applied to form the relief comprises at least a reactive monomer which, in the proposed method, diffuses into the polymeric substrate layer. Only after the reactive monomer has been absorbed by the substrate layer is curing carried out in order to immobilize the reactive monomer. After curing, no further diffusion of the reactive monomer into the substrate layer takes place. Because of the penetration of the reactive monomer into the polymeric substrate layer, the relief is not built up on the polymeric substrate, but because of the material diffusing in, the polymeric substrate layer itself is lifted and forms the relief. In contrast to the methods according to the prior art, the material of the relief is not dictated by the liquid applied or the reactive monomer; rather, the relief is composed of a mixture of the material of the polymeric substrate layer and the reactive monomer. The material of the relief thus arises from the combination of the reactive monomer contained in the liquid and the material of the polymeric substrate layer.

Application of the reactive liquid can be carried out for example by planar coating (doctoring or spraying) or by immersion or a suitable roller application method. Alternatively, the substrate layer coated with the ablated mask can also be mounted on a drum that is immersed in the reactive liquid and slowly rotates so that an even layer of liquid film is applied to the surface, or the polymeric substrate layer coated with the ablated mask can be drawn through a liquid bath.

The height of the relief formed essentially depends on the diffusion rate of the selected reactive monomer in the polymeric substrate layer and the selected exposure time and temperature. Here, the height of the relief depends on the purpose of use of the printing plate. In flexographic printing, relief printing plates having a relief depth in the range of 200 $\mu$m to 3000 $\mu$m are used. In the printing of flexible packages, the relief depth is ordinarily 200 $\mu$m to 700 $\mu$m. In other applications, for example in the area of electronics, in which conductive structures are produced on a circuit board or another substrate, relief printing plates with a relief depth in the range of 10 $\mu$m to 100 $\mu$m are required.

The polymeric substrate layer contains a first binder. Preferably, the at least one reactive monomer is selected in relation to the substrate material used or the first binder such that the diffusion rate of the reactive monomer in the first binder at room temperature (22° C.) is 0.5 $\mu$m/min to 100 $\mu$m/min, and preferably in the range of 0.5 $\mu$m/min to 10 $\mu$m/min. The exposure time is typically in the range of 10 seconds to 3,600 seconds, so that depending on the application, relief heights of 5 $\mu$m to 500 $\mu$m can be produced.

The diffusion rate is ordinarily temperature-dependent. Preferably, the desired diffusion rate of the reactive monomer into the material of the polymeric substrate layer is reached at the temperature at which application of the liquid to the surface of the substrate layer takes place. For example, application of the liquid takes place at a temperature in the range of 20° C. to 120° C. The natural upper limit of the application temperature is determined by the boiling dot of the liquid or the reactive monomer. The maximum boiling dot is ordinarily below the boiling dot of the reactive monomer.

A further essential requirement for the method according to the invention is blocking of the mask layer with respect to the selected reactive liquid. The diffusion rate of the reactive monomer into the mask layer should be lower at least by a factor of 3, and preferably a factor of 5, than the diffusion rate of the reactive monomer into the polymeric substrate layer. The mask layer preferably contains a second binder that is selected in relation to the reactive monomer such that the diffusion rate of the reactive monomer in the second binder at room temperature (22° C.) is lower at least by a factor of 3, and preferably by a factor of 5, than the diffusion rate of the reactive monomer in the first binder.

The mask layer is located on the polymeric substrate layer. While the substrate layer can have a thickness of 0.1 mm to several millimeters, the mask layer is only a few $\mu$m thin. By means of ablation with a suitable laser, the mask is produced in situ on the polymeric substrate layer. The resolution of the produced mask depends on the resolution of the selected laser. In the area of the graphics industry, resolutions of 2500 to 5000 dpi, and in the area of security printing up to 10,000 dpi (dots per inch) are common. Converted into individual dot sizes, with a selected resolution of 10,000 dpi, laser ablation can be used to produce individual holes in the mask measuring 2.5 µm by 2.5 µm.

Lasers suitable for ablation can be UV or VIS lasers or NIR or IR lasers. The ablation of the mask can be carried out in planar fashion, wherein the selected laser then processes and ablates the material in a linear pattern. Alternatively, the support with the polymeric substrate layer on which the ablatable mask layer is located can be applied to the drum of a drum layer and processed into a rounded shape. The lasers may comprise a plurality of laser beams or irradiation heads so that the ablation time is reduced. Examples of suitable laser types are $CO_2$ lasers, neodymium-YAG lasers, dye lasers, fiber lasers, or diode lasers.

In producing the mask, openings are made in the ablatable mask layer whose shape essentially corresponds to the shape of the pixels to be produced. In this case, openings are created in the mask layer by selective removal of the mask layer. The liquid passes through these openings and reaches the polymeric substrate layer to produce the relief, so that the relief structures produced are an image of the openings in the mask.

Construction of the relief is carried out by diffusing of the reactive liquid or the reactive monomer through the holes of the mask layer into the polymeric substrate layer. Because of the high resolution of the laser-ablatable mask, the method according to the invention is quite well-suited for producing fine relief structures.

In order to produce high-resolution relief structures or relief elements such as individual dots, lines, or letter elements, the corresponding pattern can be directly written into the laser-ablatable mask layer. For example, a fine line with a width of 50 µm can be built up as a relief element if a 50 µm line in the mask is lasered free by ablation. The height and the shape of the line relief produced by monomer diffusion then essentially depend on the selected exposure time or diffusion rate of the selected monomer in the selected substrate.

If the exposure time is selected such that the relief height to be built up is less than the line width of the mask, diffusion of the monomer will preferably take place into the depth of the polymeric substrate layer, and the cross-section of the built up relief line will have a rectangular configuration in a first approximation. For example, this means that with a correspondingly short exposure time, a line with a height of 5 µm and a width of 50 µm can be built up by monomer diffusion, and that in cross-section, this relief line will show a rectangular profile in a first approximation. As the diffusion of the monomer takes place not only into the depth of the polymeric substrate layer but also laterally, the line width at the surface of the relief will always be somewhat lower than the width of the line lasered free in the mask layer. This effect can be taken into account by selecting the line width lasered free in the mask such that it is larger by the distance of lateral diffusion in order to build up a relief line 50 µm in width. If one wishes to build up a relief height of 5 µm, the lateral diffusion is also on the order of 5 µm. Therefore, in order to build up a relief line 50 µm in width and 5 µm in height, the line width of the mask is preferably configured to be 10 µm (twice the lateral diffusion) wide, i.e. a 60 µm line is lasered free. When writing the openings into the mask layer, it is therefore preferable to select the dimensions of the individual openings, whose shape essentially corresponds to that of the pixels to be produced, to be larger than the dimensions of the pixels to be produced. In this case, the dimensions of the openings are enlarged by an amount that corresponds to twice the lateral diffusion of the monomer. In this case, the diameter of dots and the length and width of lines in particular are to be understood as dimensions. As the lateral diffusion corresponds in a first approximation to the relief height, it is preferred to increase the dimensions by twice the amount of the relief height.

If the exposure time is selected such that a relief height is to be built up in the size range of the line width, the diffusion of the monomer will be carried out similarly both in the depth of the polymeric substrate layer and laterally. In this case, the resulting line relief no longer has a rectangular profile, but shows rounded edges, or a line profile is produced that roughly corresponds to a Gaussian distribution curve.

If one wishes to build up relief heights that are greater than the lateral dimension of the relief element (for example a line 50 µm wide that is to be 100 µm in height), one will notice that the resulting relief element is in turn sharply widened and also no longer reaches the required relief height. Once again, the cause is lateral diffusion of the monomer. The monomer disappears in the adjacent non-image areas. The fine relief element formed thus does not reach the relief height shown by a larger relief element in which the lateral diffusion can be disregarded.

In principle, this is a desirable effect from the standpoint of printing technology. The person skilled in the art speaks of finishing of the height of the relief elements. The finer the element, the lower the relief should be in order to achieve identical printing tension for all of the relief elements. However, finishing should be positioned at most in the area of 10 µm. At higher levels, one must compensate for the greater depth of the fine relief elements in order to allow uniform printing to take place.

In order to bring the fine relief elements to the same height as larger relief elements, it may be necessary to rasterize the surrounding area of the fine relief element. By rastering of the surrounding area, the diffusion flow per unit area can be adjusted to a desired level, thus making it possible, for example, to build up a desired relief base around the relief element or to configure a flank of a relief element to be steeper or flatter. In other words, the speed of relief generation, expressed as the amount of relief formed in µm per exposure time in seconds, can be selectively adjusted by means of the number of holes per unit area at each location of the substrate surface. The formation of a base around the fine relief element reduces lateral outflow of the monomer, and the fine relief element shows a relief height that corresponds to that of larger relief elements.

Accordingly, it is preferred in producing the mask in the area surrounding openings to increase the permeability of the mask layer to the liquid. In this manner, in addition to the relief element, which is an image of the opening in the mask, a base is also built up around the relief element.

The surrounding area of an opening in the mask can be defined by an area that surrounds the opening and is delimited by a line, wherein the smallest distance of each dot of the line from the opening is predetermined in a fixed manner. The shape of the delimiting line of the area thus corresponds to the shape of the opening, but the area enclosed is larger than the area of the opening. Preferably, the distance of the demarcation line from the opening should be in the range of 0.1 mm to 5 mm, and more preferably 0.5 mm to 1 mm. The width of the base produced in this manner essentially corresponds to the distance of the demarcation line from the opening.

The rastering of the mask layer in the area surrounding an opening is preferably in the range of 20 to 80%, and preferably in the range of 40 to 60%, wherein 0% indicates no change in permeability and 100% complete opening of the mask layer.

In the generation of fine relief elements with a high relief height, moreover, special geometric effects may occur. The diffusion flow of the monomer depends on the surface area available. A relief edge or strong relief rounding formed during the diffusion process provides a greater surface area for the monomers to exert their effect, with the result that diffusion flow is greater on the edge or rounded portion of the relief element than on the formerly flat surface. As a result, relief structures having sharply pronounced edges (the person skilled in the art speaks of cupping) may occur. The effects can also be compensated for by rastering of the relief elements themselves or suitable rastering of the surrounding area.

A requirement for the use of rastering is that the selected resolution of the individual ablated holes in the area surrounding the relief elements must be much finer than the respective relief elements. The holes of the dot matrix produced in the area surrounding the openings should be at least one order of magnitude smaller than the openings or relief elements themselves. The laser for imaging of the mask should therefore be operated with a high resolution of 5,000 dpi, or most preferably with a resolution of 10,000 dpi.

The rastering of the area surrounding the relief elements is preferably carried out by the FM method (FM=frequency modulated). This means that all holes are selected to have the same size, and the varying diffusion flow is controlled by means of the number of holes per unit area. Alternatively, the holes can also be produced by the AM method (AM=amplitude modulated), i.e. the holes are selected with different sizes, or the layer thickness of the mask layer is reduced by lasering, provided that the mask layer still has low permeability for the monomer used. By means of local reduction of the layer thickness of the mask layer, the permeability for the monomer at this location is increased.

If the FM method is selected for rastering, the ablated holes should be sharply delimited, have the same diameter, and preferably have sharp edges in order to produce a defined diffusion flow. For this reason, the laser-ablatable mask layer should show high laser sensitivity.

A further requirement for this variant of the method according to the invention is that the mask layer must remain on the relief surface being formed during generation of the relief. In this case, the mask layer is stretched in the flank areas of the resulting relief. The mask layer should therefore be sufficiently flexible. It must not tear open during relief formation, as this could lead to uncontrollable diffusion effects.

After the exposure period, the excess liquid monomer is removed from the surface of the substrate layer. If application of the monomer was carried out in a tank by means of a slowly rotating drum, the tank can be lowered and the rotation speed increased so that the liquid monomer is spun off. In this method variant, the mask remains on the relief plate.

In a preferred embodiment, the excess liquid monomer is rinsed off by means of a suitable solvent, wherein this solvent must not cause the polymeric substrate layer to swell. Preferably, the solvent is selected such that the mask layer can also be washed off with the liquid monomer, with only the relief plate remaining. After this, the adhering solvent can be completely removed from the surface using compressed air or an air knife. A suitable solvent is for example a mixture of an alcohol and water, for example a mixture of n-propanol and water with a mixing ratio of 1:1.

After removal of the excess monomer, the relief plate is immediately cured. As the diffusion processes of the monomer into the polymeric substrate continue even when the excess monomer has been removed, and these diffusion processes impar imaging accuracy, it is recommended to carry out removal of the monomer, washing off of the remnants of the mask layer, and removal of the solvent as quickly as possible and then to begin the curing pass immediately. In order to obtain reproducible results, the processing times should be precisely observed. In this case, the predetermined exposure time, the time required for liquid playback, and the time required for the curing pass in particular are considered to constitute processing times.

In curing of the relief, the reactive monomer forms a three-dimensional network with the polymer of the substrate layer, and further diffusion of the reactive monomer into the substrate layer is stopped. For example, curing can be carried out by the effect of heat or radiation. Preferably, the substrate layer is photochemically cured. The most preferable curing method is photopolymerization. For this purpose, reactive monomers are used in combination with photoinitiators that can be cured by the action of electromagnetic radiation, in particular ultraviolet light. Here, the photoinitiators are preferably not added to the liquid, but are already contained in the polymeric substrate layer. Ultraviolet light (UV light) has a wavelength in the range of 100 nm to 400 nm. Particularly preferably, photoinitiators and reactive monomers are used in this case that can be cured by the action of UVA radiation. UVA radiation has a wavelength in the range of 320 nm to 400 nm. In order to detackify the surface of the relief printing plate, this can be followed by curing with UVC radiation. UVC radiation has a wavelength in the range of 100 to 280 nm.

For curing, for example, a UV light source can be provided, in particular a light source with radiation in the UVA region. For example, the UV light source can be configured as an LED (light-emitting diode) strip that is moved relative to the support in order to pass over its entire surface.

Chemistry of the Respective Layers/Input Materials

In principle, the method may be carried out with any desired polymeric substrate layer. However, there are particular dependencies among the polymer selected for the substrate layer, the reactive liquid used, and the material of the mask layer, with the result that in practical terms, only certain combinations can be selected.

The polymer of the substrate layer will be selected depending on the application of the printing plate. For example, if one wishes to build up a hard letterpress plate that is later to be printed with viscous UV inks or oil-based ink, one will select a hard, polar polymer such as polyvinyl alcohol or polyamide for reasons of swelling resistance. In order to achieve a sufficient diffusion rate, one will select for the reactive liquid a monomer that is compatible with the polymer of the substrate layer, i.e. a polar monomer such as an acrylate with polar OH— or COOH functional groups. Conversely, one will then select a non-polar binder as the binder of the mask layer in order to ensure the barrier action against the polar monomer.

If one wishes to build up a flexible flexographic printing plate that is to be printed with alcohol- or water-based polar, low-viscosity printing inks, one will in turn select a flexible nonpolar polymer as a binder of the substrate later for reasons of swelling resistance. In order to achieve a sufficient diffusion rate, one will now select a nonpolar monomer for the reactive liquid and use a polar binder as the polymer for the barrier mask layer in order to ensure the barrier action against the non-polar monomer.

In the following, material combinations are described that are preferably used for the generation of a flexible flexographic printing plate.

Composition of the Support

The support used is preferably configured as a composite material and comprises
i) a dimensionally stable support layer in the form of a support film or a dimensionally stable support sleeve,
ii) the polymeric substrate layer,
iii) the laser-ablatable mask layer, and
iv) optionally, a protective cover sheet.

The dimensionally stable support layer can for example be a dimensionally stable support film such as a polyester film or a sheet metal such as aluminum or steel. Examples of suitable materials for the dimensionally stable support film are polyethylene terephthalate (PET), polybutylene terephthalate (PBT), polyethylene-naphthalate (PEN), or polycarbonate (PC). Particularly suitable are PET films in a thickness of 100 μm to 200 μm.

In an embodiment of the invention, the support layer is a dimensionally stable support sleeve or cylinder sleeve. Optionally, further intermediate layers can be disposed between the dimensionally stable support film, the dimensionally stable metal support, or the dimensionally stable cylinder sleeve and the substrate layer. For example, such an intermediate layer can be an adhesion-promoting layer.

If the flexographic printing element has a cylindrical shape (sleeve), suitable dimensionally stable support sleeves include cylindrical polyester sleeves, glass-fiber-reinforced polyester sleeves, or other round support materials such as nickel sleeves. These cylindrical support sleeves have a thickness of 0.1 mm up to a few mm.

The polymeric substrate layer, which contains as essential components a first polymeric binder, a photoinitiator, and further optional components, is disposed on the dimensionally stable support film or support sleeve.

In order to achieve the flexible properties of the printing plate typical for flexographic printing, soft, elastomeric materials are preferably used as the binder of the polymeric substrate layer (first binder).

Examples of suitable soft, elastomeric materials include polybutadiene, polyisoprene, copolymers of butadiene and styrene, copolymers of isoprene and styrene, styrene-butadiene block copolymers, styrene-isoprene block copolymers, styrene-ethylene/butylene block copolymers, styrene/isoprene/butadiene/styrene block copolymers, ethylene-propylene-diene rubbers, silicone rubbers, natural rubbers, chloroprene rubbers, nitrile rubbers, polyisobutylene, and flexible polyurethane.

Thermoplastically workable, elastomeric block copolymers are preferably used. The thermoplastic elastomeric block copolymers comprise at least one block essentially composed of alkenyl aromatics and at least one block essentially composed of 1,3-dienes. Examples of suitable alkenyl aromatics include styrene, α-methyl styrene, or vinyl toluene. Styrene is preferred. The 1,3-dienes are preferably butadiene and/or isoprene. These block copolymers may be linear, branched, or radial block copolymers. They are generally three block copolymers of the A-B-A type, but they can also be two-block polymers of the A-B type or those with a plurality of alternating elastomeric and thermoplastic blocks, e.g. A-B-A-B-A. Mixtures of two or more different block copolymers can also be used. Commercially available three-block copolymers often contain a certain proportion of two-block copolymers. The diene units can be 1,2- or 1,4-bonded. Moreover, thermoplastic elastomeric block copolymers with end blocks of styrene and a statistical styrene-butadiene midblock can also be used. Of course, mixtures of a plurality of thermoplastic-elastomeric block copolymers can also be used.

Moreover, thermoplastically workable elastomeric block copolymers can be used that are partially or fully fluorinated or are incorporated into the fluorinated side chains. These polymers impart to the substrate layer an ink-repellent property that has a beneficial effect in low-relief printing, in particular in applications in the field of electronics.

The thermoplastic elastomeric material of the polymeric substrate layer is preferably composed primarily of a polymer selected from poly(styrene-butadiene-styrene) (SBS), poly(styrene-isoprene-styrene) (SIS), poly(styrene-isoprene-butadiene-styrene) (SIBS), ethylene propylene diene monomer rubber (EPDM) and other SB block copolymers. Also suitable are poly(styrene-butadiene/styrene-styrene) block copolymers, which are commercially available under the brand name Styroflex®.

The total amount of binders or polymers used in the polymeric substrate layer is ordinarily 50 to 100 wt. % with respect to the total components of the substrate layer, preferably 50 to 90 wt. %, and particularly preferably 60 to 85 wt. %.

As a rule, the polymeric substrate layer comprises one or a plurality of photoinitiators. Suitable photoinitiators or photoinitiator systems include benzoin or benzoin derivatives such as methylbenzoin or benzoin ether, benzil derivatives such as benzil ketals, acylaryl phosphine oxides, acylaryl phosphinic acid esters, multinuclear quinones, or benzophenones. As a rule, the amount of photoinitiator in the polymeric substrate layer is 0.1 to 10 wt. %, preferably 1 to 5 wt. %, and particularly preferably 1.5 to 3 wt. %, based on the amount (by weight) of all the components of the substrate layer.

If the material of the polymeric substrate layer contains a photoinitiator, it is preferable for the liquid containing the reactive monomer to be free of photoinitiators. As the reactive monomer diffuses into the substrate layer after application to its surface and the photoinitiator is already present in the substrate layer, no photoinitiator need be added to the liquid. By not using a photoinitiator in the liquid, the liquid can be handled more easily and safely, as the risk of undesired curing before application to the substrate layer is reduced.

The material used for the polymeric substrate layer is preferably free of reactive monomers or contains less than 10 wt. %, preferably less than 5 wt. %, of reactive monomers. As the reactive monomers diffuse with the liquid into the polymeric substrate layer, the polymeric substrate layer must not contain any reactive monomers. It is also advantageous to have the lowest possible content of reactive monomers in the polymeric substrate layer because the properties of the relief produced are then essentially determined by the first binder or the material of the polymeric substrate layer.

From the standpoint of printing technology, however, it may be advantageous for the polymeric substrate layer to already contain a small amount of reactive monomer, preferably less than 10 wt. % and particularly preferably less than 5 wt. %. After generation and curing of the relief, not only the relief components formed, but all areas of the relief printing plate are cured, thus achieving a relief printing plate with uniform mechanical properties in the relief base and in the elevated relief areas.

The polymeric substrate layer can optionally contain one or a plurality of plasticizers. Examples of plasticizers include paraffinic, naphthenic, or aromatic mineral oils, synthetic oligomers or resins such as oligostyrene, high-boiling-point esters, oligomeric styrene-butadiene copolymers, oligomeric α-methylstyrene/p-methylstyrene copolymers, liquid oligobutadienes, liquid polyisoprenes, in particular those having an average molecular weight between 500 and 5000 g/mol, or liquid oligomeric acrylonitrile-butadiene copolymers or oligomeric ethylene-propylene-diene copolymers. Preferred plasticizers include white oil, butadiene oil, and paraffin oil.

As a rule, the total amount of plasticizers in the polymeric substrate is 0 to 50 wt. %, and preferably 5 to 30 wt. %. The amount of plasticizers also depends on the respective binder system. In relief printing plates based on a styrene-isoprene binder system, plasticizer amounts of 1 to 10 wt. % have proven to be suitable. In relief printing plates based on a styrene-butadiene binder system, plasticizer amounts of 20 to 40 wt. % have proven to be suitable.

The polymeric substrate layer may optionally also contain further additives, such as mineral fillers, compressible additives, pigments, or dyes. Examples of suitable fillers include silicates and quartz powders, which alter the surface topography of the substrate layer and can affect color transfer during printing. The compressibility of the substrate layer can be increased by adding hollow microspheres.

The amount of fillers is ordinarily less than 50 wt. %, and preferably less than 20 wt. %, based on the total components of the polymeric substrate layer.

Moreover, the polymeric substrate layer can contain surface-active substances such as waxes, silicone oils, or fluorinated compounds. As described above, it may be necessary for relief printing plates having a low relief to make the surface of the polymeric substrate layer ink-repellent. This is done by adding surface-active substances that diffuse on the surface of the polymeric substrate layer, where they can form a hydrophobic, i.e. ink-repelling, protective film. The protective film should preferably form on the surface of the substrate layer only after curing of the relief printing plate, as the diffusion of the monomer may otherwise be impaired. The amount of surface-active substances in the polymeric substrate layer is ordinarily less than 5 wt. %, and preferably less than 2 wt. %.

The thickness of the polymeric substrate layer essentially depends on the respective application or the desired relief height. The thickness of the polymeric substrate layer should generally be greater than the desired relief height. For applications in the field of electronics, in which low relief heights are required, polymeric substrate layers 0.1 mm to 1.0 mm in thickness can be used. For typical flexographic printing, relief heights of 0.3 mm to 3.0 mm are required. In this case, the polymeric substrate layers should accordingly be at least 0.5 mm to 3.0 mm thick. For printing on corrugated cardboard, even thicker substrate layers up to 6 mm in thickness can be used.

The polymeric substrate layer is produced either by casting from solution or from the melt by extrusion and calendering. In the applications according to the invention, a constant thickness of the polymeric substrate layer over the coating width and length is of decisive importance. The maximum deviation in layer thickness should be ±10 μm in layer thickness of less than 1 mm. In layer thicknesses of 1 mm to 3 mm, the maximum deviation in layer thickness should be ±15 μm.

The laser-ablatable mask layer is located on the surface of the polymeric substrate layer. The mask layer is to be ablatable by a laser and is to have a barrier effect against the reactive liquid or monomer used, i.e. diffusion of the monomer through the mask is not to take place.

The laser-ablatable mask layer is composed of at least one second polymeric binder and at least one light-absorbing component, wherein the second polymeric binder can also simultaneously be the light-absorbing component.

The selection of the polymeric binder of the mask layer (second polymeric binder) depends on the respective application of the printing plate. If one wishes to produce flexible, non-polar flexographic printing plates by the method of the invention, one will select a polar binder as the binder for the mask layer in order to ensure the barrier action against the non-polar monomers.

If the support in the method according to the invention is mounted on a drum laser for ablation, the mask layer must be sufficiently flexible. In this case, the mask layer is considered to be sufficiently flexible if it shows no cracks on bending of the support onto the drum and the mask layer shows no corrugations, wrinkles, or other surface structures on disassembly of the polymeric support.

The mask layer should be favorably ablatable. The ablation process should give rise to sharp-edged structures. In particular, there should be no melted edges or deposits from the ablation exhaust around the ablated holes.

Examples of highly suitable polar binders for the mask layer include polyvinyl alcohols, low-, medium, or high-saponification polyvinyl acetate, polyvinyl acetals such as polyvinyl butyral, water- or alcohol-soluble polyamides, alcohol-soluble polyurethanes or polyesters, polyacrylic acid, cellulose or cellulose derivatives such as hydroxypropylcellulose or hydroxyethylcellulose or nitrocellulose, ethylene-vinyl alcohol copolymers, polycyanoacrylates, polyethylene oxide, or polyethylene oxide copolymers.

Polyvinyl acetates with an average degree of saponification of 50 to 90 mol % are particularly suitable. Strictly speaking, these binders are copolymers of vinyl acetate and vinyl alcohol units. These binders are sufficiently polar, have a barrier action against non-polar monomers, and have good flexibility, and they also show favorable ablation properties. Of course, mixtures of the above-mentioned binders can also be used.

The laser-ablatable mask layer contains the binder(s) in an amount of 50 to 99 wt. % based on the total components of the mask layer.

The mask layer further contains a light-absorbing component. Depending on the type of laser to be used for ablation, the mask layer also contains, in addition to the second polymeric binder, UV absorbers or UV-absorbing dyes or pigments (UV lasers), VIS dyes or NIR dyes, or NIR pigments or IR pigments (VIS-, IR lasers).

Preferably, carbon black, graphite, nanosized carbon black particles, or carbon nanotubes are used as the light-absorbing components. Carbon black as a light-absorbing component has the advantage that no migration from the mask layer into the underlying polymeric substrate layer takes place.

Provided that the light-absorbing component is not identical to the second polymeric binder, the weight percentage of the light-absorbing component can be 1 wt. % to 60 wt. %. The amount depends on the layer thickness of the mask layer, which has a thickness of 0.5 μm to at most 10 μm, and preferably 0.5 µm to 3 µm. With layer thicknesses of less than 0.5 µm, it is difficult to produce a homogenous, sealed layer having a barrier action. With layer thicknesses greater than 10 µm, the ablation energy required is too high, and the ablation times are too long. The light absorption of the mask layer in the range of the wavelength of the laser used should be >10%.

The mask layer can also optionally contain further components such as plasticizers, crosslinking components, dispersion auxiliaries, flow promoters, adhesive components, or surface-active substances.

As a rule, there is also a protective cover sheet on the laser-ablatable mask layer that is peeled off before use, i.e. before lasering. PET films are again well-suited for this purpose, preferably in a thickness of 50 µm to 150 µm. In order to ensure that the cover sheet can easily be peeled off, it can be provided with an anti-adhesive coating, or a siliconized cover sheet can be used.

For producing the laser-ablatable mask layer, any application method commonly used for thin layers can be applied, such as spraying, doctoring or roller application methods. In a preferred embodiment, the mask layer is first applied to the cover sheet, and the coated cover sheet is then laminated onto the polymeric substrate layer. If the polymeric substrate layer is produced by melt extrusion with subsequent calendering, the support film and the cover sheet coated with the mask layer are inserted over the calender rollers and thus firmly bonded to the polymeric substrate layer. After cooling of the composite, individual plates are cut from the sheet.

If the polymeric substrate layer is on a cylindrical support, the mask layer is either sprayed on or applied by a roller coating method. As a rule, no cover sheet is used in this variant embodiment.

The liquid used in the method according to the invention comprises at least one reactive monomer. As described above, any reactive monomers desired can generally be used. Preferably, ethylenically unsaturated compounds are used that can be cured in combination with photoinitiators by photopolymerization.

Preferred monomers therefore have at least one polymerizable, ethylenically unsaturated double bond. Esters and amides of acrylic acid or methacrylic acid with mono- or polyfunctional alcohols, amines, amino alcohols or hydroxy ethers and -esters, esters of fumaric or maleic acid or allyl compounds have been found to be particularly advantageous. Most particularly preferred monomers are mono-, di- and triacrylates and -methacrylates.

Examples of suitable monomers are methyl methacrylate, ethyl acrylate, propyl (meth)acrylate, butyl (meth)acrylate, 2-ethylhexyl acrylate, lauryl acrylate, butanediol di(meth)acrylate, hexanediol di(meth)acrylate, nonanediol di(meth)acrylate, dodecanediol di(meth)acrylate, trimethylol propane tri(meth)acrylate, hydroxyethyl (meth)acrylate, ethylene glycol (meth)acrylate, ethylene glycol di(meth)acrylate, tri- or tetraethylene glycol (meth)acrylates, glycerol di(meth)acrylate, propylene glycol mono- or -di(meth)acrylates, trimethylol propane tri(meth)acrylate, pentaerythritol tetra(meth)acrylate, and poly(ethylene oxide) acrylates or -methacrylates or poly(propylene oxide) acrylates or -methacrylates.

Further suitable reactive monomers can be glycidyl (meth)acrylate, phenyl glycidyl ether (meth)acrylate, benzyl (meth)acrylate, cyclohexyl (meth)acrylate, isobornyl (meth) acrylate, dihydrodicyclopentadienyl (meth)acrylate, limonene (meth)acrylate, hexene (meth)acrylate, dimethylaminoethyl(meth)acrylate, and bisphenol-A-diglycidyl ether di(meth)acrylate. Further suitable monomers are acrylamides or methacrylamides such as hexamethylene bis(meth) acrylamide. Examples of suitable fumarates include diethyl fumarate, dibutyl fumarate, and dioctyl fumarate. Suitable maleic acid derivatives include, for example, dibutyl maleinate, dioctyl maleinate, and lauryl maleinimide.

Further suitable substances are polyester (meth)acrylate, polyether (meth)acrylate, polyurethane (meth)acrylate, polybutadiene (meth)acrylate, and polyisoprene (meth)acrylate. The acrylates or methacrylates can further contain functional groups such as amide groups, sulfonic acid ester groups, or sulfonic acid amide groups. Partially or completely fluorinated acrylates or methacrylates and silicone acrylates are also suitable. Of course, mixtures of a plurality of different monomers may also be used.

As described above, the selection of the monomer depends to a decisive degree on the material of the polymeric substrate layer. If the method according to the invention is to be used to build up nonpolar, flexible flexographic printing plates, relatively non-polar monomers such as ethylhexyl acrylate, hexanediol diacrylate, hexanediol dimethacrylate, dodecanediol diacrylate, dodecanediol dimethacrylate, cyclohexyl acrylate, cyclohexyl methacrylate, isobornyl acrylate, isobornyl methacrylate, dihydrodicyclopentadienyl acrylate or -methacrylate and silicone acrylates or fluorinated acrylates are to be used.

If the method according to the invention is to be used to build up polar, hard letterpress plates, polar monomers such as hydroxyethyl acrylate, ethylene glycol acrylate, polyethylene glycol acrylate, glycerin acrylate, phenyl glycidyl ether acrylate, trimethylolpropane triacrylate or the corresponding methacrylates are preferably used.

The at least one reactive monomer is preferably contained in the liquid in an amount of 50 wt. % to 100 wt. %, and particularly preferably in an amount of 80 wt. % to 100 wt. %. Most particularly preferably, the reactive liquid contains more than 90 wt. % of the monomer.

Optionally, the liquid can also comprise further components. The further components are preferably selected from photoinitiators, plasticizers, emulsifiers, diffusion auxiliaries, solvents and surface-active substances.

Preferably, the reactive liquid does not contain a photoinitiator, as this is already present in the polymeric substrate layer. Optionally, however, the reactive liquid can also contain one or a plurality of photoinitiators. The amount of photoinitiator in the liquid can be 0 wt. % to 10 wt. %.

The invention further relates to an imageable relief printing plate with a support, comprising a dimensionally stable support layer, a polymeric substrate layer, and a laser-ablatable mask layer. In this case, the polymeric substrate layer and the laser-ablatable mask layer are selected such that the diffusion rate of a reactive monomer into the laser-ablatable mask layer is lower at least by a factor of 3 than the diffusion rate into the polymeric substrate layer. The imageable relief printing plate according to the invention is configured for use with the method described, so that features described within the scope of the invention are also disclosed for the relief printing plate.

A further aspect of the invention is the provision of a device for producing relief printing plates. The device is preferably designed and/or configured for carrying out the method described herein. Accordingly, features described within the context of the method apply mutatis mutandis to the device, and conversely, the features described within the context of the device apply mutatis mutandis to the method.

The device advantageously comprises two apparatuses, wherein a first apparatus is used for lasering of the mask layer and a second apparatus is used for the further method steps. For imagewise lasering, any commercially available drum or flat bed laser may be used as the first apparatus. In this case, a laser imager with a resolution of more than 2540 dpi, particularly preferably 5080 dpi, is preferably used.

For application of the monomeric liquid and removal of the excess liquid after the end of the diffusion process, washing off of the mask, and fixation of the resulting relief, units configured for the respective method step can be used that are integrated into a common device. Alternatively, one or a plurality of the units used can be configured as a separate device. As the removal of the excess monomer, washing off of the mask, and fixation of the relief by means of UVA light are to be carried out as quickly as possible, it is recommended to carry out this method step in a device that integrates all of the units required.

The invention and the method according to the invention will be explained in the following examples.

Figure 1:
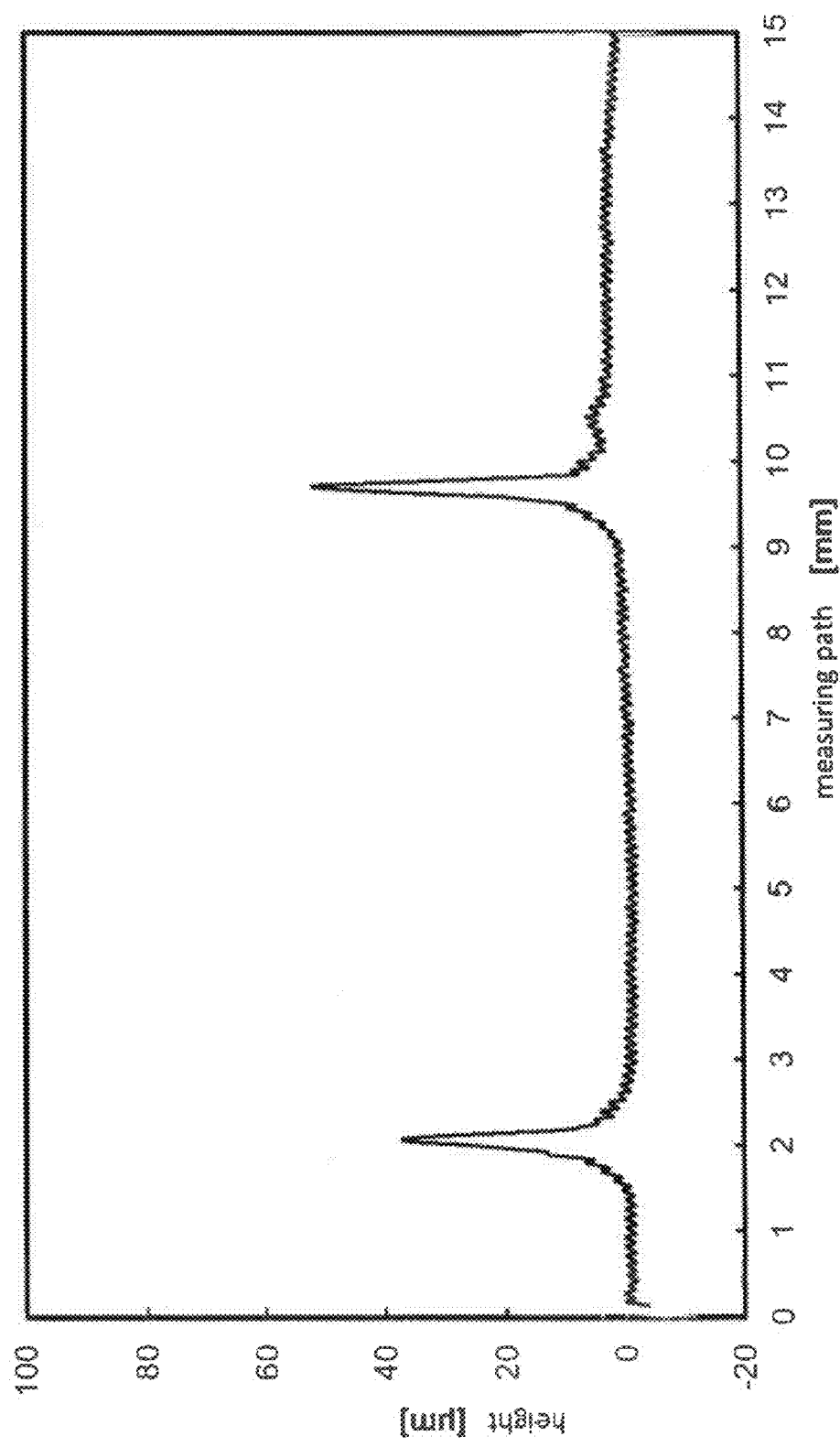
FIG. 1 shows Perthometer measurement of a relief with two lines.

The following input materials were used (all figures in % indicate wt. %):

Quintac 3621C, radial styrene-isoprene-styrene block copolymer with 15% styrene from Nippon Zeon.

BDK, benzildimethyl ketal from BASF.

White oil Winog 70, paraffinic white oil from Shell.

HDDA, hexanediol diacrylate, HDMA2, hexanediol dimethacrylate, EHA, 2-ethylhexyl acrylate, monomers from BASF.

Levanyl Schwarz A-SF, aqueous carbon black dispersion from Lanxess.

Zonyl FSN, flow promoter from DuPont.

Examples

Test 1
Production of the Polymeric Support Layer

A polymer mixture composed of 85% Quintac 3621C, 5% BDK, and 10% white oil Winog 70 was melted in a model ZSK53 twin-screw extruder, homogenized, and discharged through a wide-slit nozzle and then calendered between two PET films. A 100 µm thick siliconized Mylar PET film was used as a cover sheet. A Melinex D 740 film 125 µm in thickness than had been pre-coated with a layer of adhesive varnish 5 µm in thickness was used as a support film. The total thickness of the composite of support film, polymeric substrate layer, and cover sheet was 1.8 mm. The composite was peeled off on a vacuum suction band, and after cooling, cut into individual plates.

Production of the Laser-Ablatable Mask Layer

A coating solution of 70% Alcotex 72.5, 29.8% Levanyl Schwarz A-SF, and 0.02% Zonyl FSN was produced in a solvent mixture (water/n-propanol 3:1) with a solid content of 5%. The coating solution was blade-coated onto a 100-µm-thick Mylar film and dried. The mask layer produced had a dry layer thickness of 3 µm.

Production of the Polymeric Support Layer with the Laser-Ablatable Mask Layer

The siliconized mylar film was peeled off the polymeric support layer, and the Mylar film coated with the laser-ablatable mask layer was laminated onto the polymeric substrate layer at a laminating temperature of 120° C. After cooling of the composite, the Mylar film was peeled off, leaving the laser-ablatable mask layer remaining on the polymeric substrate layer.

Determination of the Diffusion Rate of the Monomers

In order to determine the diffusion rate of the various monomers in the polymeric substrate layer, the laser-ablatable mask layer was peeled off the polymeric support layer. An aluminum template 0.5 mm in thickness was placed on the surface of the polymeric substrate layer and fixed in place with weights. The template contained punched holes having diameters of 1 mm, 3 mm and 10 mm. The respective monomer was poured into the holes of the template at room temperature (22° C.) and left on the polymeric substrate layer for a defined exposure time. After this, excess monomer was removed by rinsing with n-propanol, and the resulting relief was fixed by irradiation with UVA light (10 minutes, tube exposure, nyloflex FIII exposure unit from Flint Group). After this, the surface was exposed to UVC light for a further 3 minutes (nyloflex F III exposure unit) in order to detackify the surface. The relief plateau was then measured using a Perthometer.

If the experiment is carried out with different exposure times (1 minute, 10 minutes, 20 minutes, 60 minutes), one finds that the height of the relief plateau formed increases linearly with exposure time in a first approximation. Based on the slope of the lines, one can determine a diffusion rate in µm per unit time for a given monomer/substrate pair. For the substrate material described, the defusion rates of HDDA, HDMA and EHA were determined (cf. Table 1). It is to be noted that the diffusion rates determined in this manner do not correspond precisely to the diffusion rates ordinarily defined in the scientific field. Rather, these are empirically determined diffusion rates that can be used to predict the structure of a relief according to the method of the invention.

In order to determine the barrier action of the laser-ablatable mask layer, the tests were repeated with the three selected monomers, this time placing the aluminum template on the composite of support film, polymeric substrate layer, and laser-ablatable mask layer. Within the range of measurement accuracy, no relief formation was observed, even with the maximum exposure time (60 minutes).

TABLE 1

| Monomer | Diffusion rate in µm/min (polymeric substrate layer) | Diffusion rate in µm/min (laser ablatable mask layer) |
| --- | --- | --- |
| HDDA | 0.7 | <0.1 |
| HDMA | 1.3 | <0.1 |
| EHA | 4.4 | <0.1 |

IR Laser Imaging

The composite of support film, polymeric substrate layer, and laser-ablatable mask layer was fixed on the drum of an IR laser (Thermoflex 20, Xeikon) and imaged with power of 30 W at a resolution of 5,080 dpi. Individual lines of different widths (20 µm, 40 µm, 60 µm, 80 µm, 100 µm and 500 µm) and 3-point lettering were written in as image data.

Relief Generation by Diffusion

The plate imaged in this manner was then mixed in a tank at room temperature with a reactive monomer mixture. A solution of equal parts of HDDA and HDMA was used as the monomer mixture. After an exposure time of 1 hour, the plate was removed from the tank and rinsed off with a 1:1 mixture of water and n-propanol. In this case, excess monomer was removed from the substrate surface, and the laser-ablatable mask layer was washed away at the same time. The wet plate was then carefully blown dry with compressed air and then immediately irradiated with UVA light for 10 minutes on a tube exposure unit (nyloflex F III, Flint Group), thus fixing the resulting relief. For detackification, the relief printing plate was then irradiated for 3 more minutes with UVC light, thus detackifying the surface.

Evaluation of the Relief Printing Plate

Figure 2:
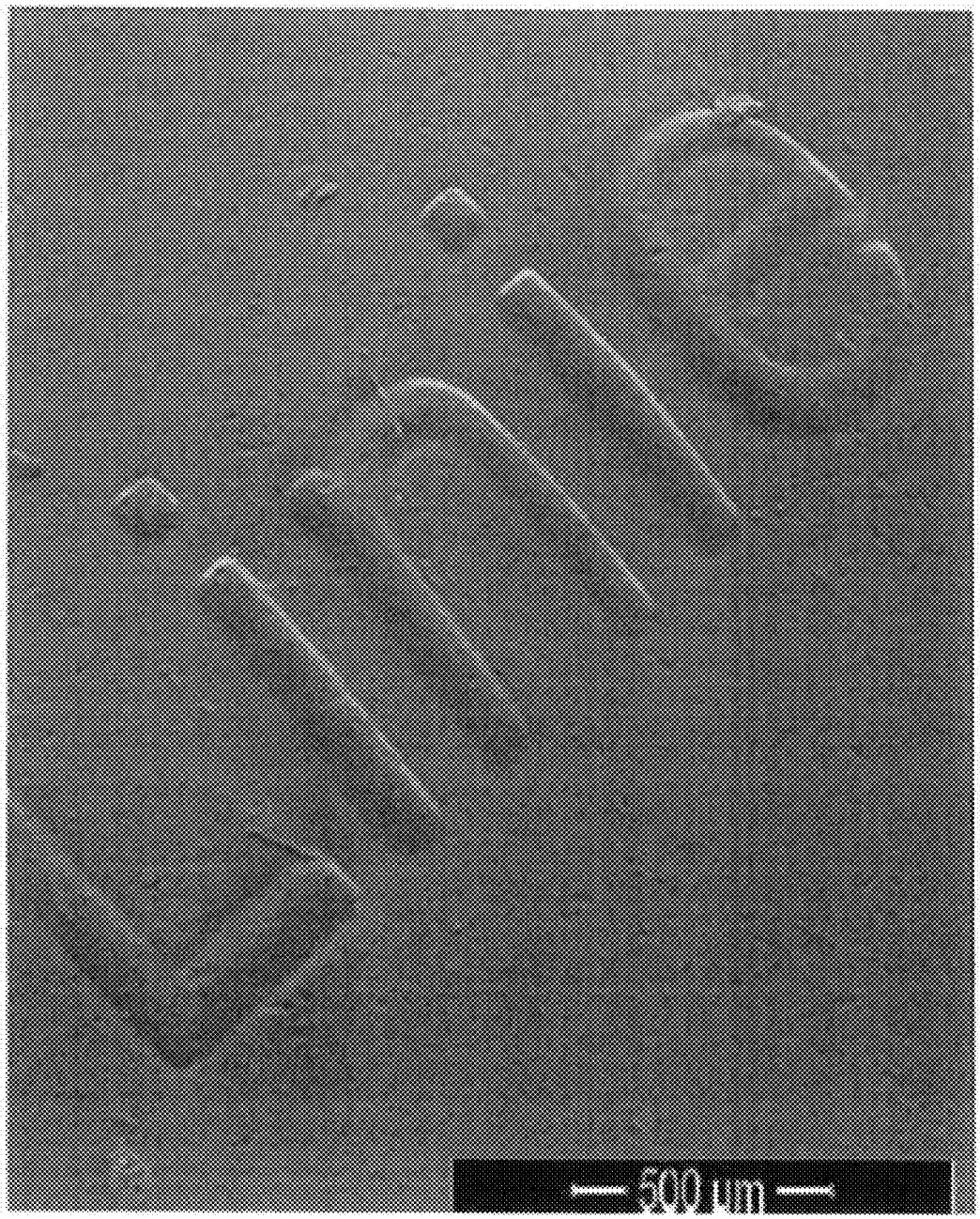
FIG. 2 shows an electron micrograph of a formed relief.

The relief printing plate was then evaluated by means of Perthometer measurements and electron micrographs. FIG. 1 shows an example of Perthometer measurement of the sharply formed 80 μm and 60 μm lines. FIG. 2 shows an electron micrograph of the writing relief formed. The relief heights of the respective relief lines were determined from the Perthometer diagrams. The results are summarized in Table 2. While the line element 500 μm in width shows an expected relief height of 60 μm, the finer line elements do not reach the required relief height due to lateral diffusion of the monomers. The 20 μm line could no longer be measured by the Perthometer.

Test 2

The test was then repeated with modification of the area surrounding the line elements on both sides with a 50% matrix 0.5 mm in width. The plate was again lasered with a resolution of 5080 dpi. The individual ablated holes in the area surrounding the line element had a diameter of 5 μm. The subsequent procedure was as in test 1. The resulting line profiles were again measured using the Perthometer. As expected, the lines were now formed on a planar base 1 mm in width that was 30 μm height in accordance with the rastered tone value of 50%. The absolute line height (total of base height and line height) now reached the predetermined height of 60 μm±10 μm for all of the line widths.

TABLE 2

| Width of line element | Relief height without base/without surrounding matrix | Relief height with base/with surrounding matrix |
|---|---|---|
| 500 μm | 60 μm | 60 μm |
| 100 μm | 55 μm | 55 μm |
| 80 μm | 50 μm | 60 μm |
| 60 μm | 40 μm | 60 μm |
| 40 μm | 10 μm | 55 mm |
| 20 μm | <10 μm | 50 μm |

The relief printing plate produced in this manner was then glued to the cylinder of a flexographic printing machine using a compressible adhesive tape and printed with a low-viscosity flexographic ink. The printing parameters are summarized in Table 3.

TABLE 3

| | |
|---|---|
| Printing machine | F&K FP 6S/8 |
| Substrate | PE film |
| Printing ink | Siegwerk NC4012 Cyan |
| Viscosity of printing ink | 22 sec |
| Anilox roller | 460 L/cm, 3.5 g/cm³ |
| Adhesive tape | Lohmann 5.3 |
| Printing rate | 50 m/min |

Because of the low relief height, the plate was printed without overprinting, i.e. by means of so-called kiss printing. All of the line elements were reproduced in printing with sharp edges. The tests show that flexographic relief printing plates can be produced by means of the method according to the invention that allow the production of high-resolution relief structures with low relief height.

The invention claimed is:

1. A method for the production of relief printing plates comprising the following steps:
    a) providing a support with a polymeric substrate layer and a laser-ablatable mask layer, wherein the polymeric substrate layer contains a first polymeric binder,
    b) producing a mask with openings corresponding to pixels by imagewise laser ablation of the mask layer,
    c) applying a liquid containing a reactive monomer over the surface of the mask,
    d) diffusion of the reactive monomer through the openings of the mask into the polymeric substrate layer for a predetermined exposure time, wherein a relief is formed,
    e) removing non-diffused monomer from the surface, and
    f) fixing of the resulting relief by cross-linking.

2. The method according to claim 1, wherein the polymeric substrate layer contains a photoinitiator.

3. The method according to claim 1, wherein the substrate layer is free of reactive monomer or contains less than 10 wt. % of reactive monomer.

4. The method according to claim 1, wherein the laser-ablatable mask layer contains a second polymeric binder and a light-absorbing component, wherein the diffusion rate of the reactive monomer in the second polymeric binder at room temperature is less than in the first polymeric binder.

5. The method according to claim 4, wherein the second binder is polyvinyl alcohol, partially or highly saponified polyvinyl acetate, polyvinyl butyral, cellulose, nitrocellulose, polyethylene oxide-polyvinyl alcohol copolymers, polycyanoacrylate or polyamide.

6. The method according to claim 1, wherein the application of the liquid to the mask in step c) takes place by immersion, roller application, spraying or doctoring.

7. The method according to claim 4, wherein the light-absorbing component is carbon black, graphite, nanosized carbon black particles or carbon nanotubes.

8. The method according to claim 1, wherein the first binder is styrene-butadiene-styrene (SBS), styrene-isoprene-styrene (SIS), styrene-butadiene/styrene-styrene, styrene-isoprene-butadiene-styrene (SIBS), styrene-butadiene (SB) block copolymers, or ethylene propylene diene monomer (EPDM) rubber.

9. The method according to claim 1, wherein the reactive monomer is ethylhexyl acrylate, hexanediol diacrylate, dodecanediol diacrylate, cyclohexyl acrylate, isobornyl acrylate, or the corresponding methacrylates.

10. The method according to claim 1, wherein the liquid is free of photoinitiators.

11. The method according to claim 1, wherein crosslinking of the relief according to step f) takes place by exposure to UV light.

12. The method according to claim 1, wherein the diffusion rate of the reactive monomer in the first polymeric binder at room temperature is at least 0.5 μm/minute and at most 10 μm/minute.

13. The method according to claim 1, wherein the exposure time in step c) is 1 minute to 60 minutes.

14. The method according to claim 1, wherein the relief formed has a height of 5 μm to 500 μm.

15. The method according to claim 1, wherein in producing the mask according to step b), the dimensions of the openings are greater than the relief elements to be produced.

16. The method according to claim 1, wherein in producing the mask according to step b), in an area around the openings, the permeability of the mask for the liquid is increased by writing in of a dot matrix, wherein further openings are produced at the dots of the dot matrix.

17. The method according to claim 16, wherein the dot matrix has a resolution of at least 5,000 dpi.

18. The method according to claim 5, wherein the non-diffused monomer and the mask layer are rinsed off with a mixture of an alcohol and water in step e).

* * * * *